United States Patent
Capote et al.

[11] Patent Number: 5,716,663
[45] Date of Patent: Feb. 10, 1998

[54] MULTILAYER PRINTED CIRCUIT

[75] Inventors: Miguel A. Capote, Carlsbad; Prudeep Gandhi, Del Mar; Hope M. Viajar, Rancho Santa Margarita; Wesley W. Walters, San Clemente; Catherine Gallagher, San Marcos, all of Calif.

[73] Assignee: Toranaga Technologies, Carlsbad, Calif.

[21] Appl. No.: 483,079

[22] Filed: Jun. 7, 1995

Related U.S. Application Data

[60] Continuation-in-part of Ser. No. 324,060, Oct. 17, 1994, which is a division of Ser. No. 769,892, Oct. 1, 1991, Pat. No. 5,376,403, which is a continuation-in-part of Ser. No. 477,678, Feb. 9, 1990, abandoned.

[51] Int. Cl.$^6$ .................................................. B05D 5/12
[52] U.S. Cl. .................. 427/96; 156/277; 252/512; 427/97; 427/265; 427/282; 427/294
[58] Field of Search ................... 148/24, 25; 252/512, 252/513, 514, 518; 427/96, 97, 265, 294, 282; 156/277

[56] References Cited

U.S. PATENT DOCUMENTS

| | | | |
|---|---|---|---|
| 4,503,090 | 3/1985 | Brown et al. | 427/96 |
| 4,631,111 | 12/1986 | Williston | 430/312 X |
| 4,789,411 | 12/1988 | Eguchi et al. | 148/24 |
| 4,870,746 | 10/1989 | Klaser | 29/620 |
| 4,996,005 | 2/1991 | Saito et al. | 252/512 |
| 5,139,819 | 8/1992 | Frentzel et al. | 427/96 X |
| 5,376,403 | 12/1994 | Capote et al. | 427/96 |

FOREIGN PATENT DOCUMENTS 52-48810  4/1977  Japan.

*Primary Examiner*—Michael Lusignan
*Attorney, Agent, or Firm*—Gray Cary Ware & Freidenrich

[57] ABSTRACT

Methods for fabricating single and multilayer printed boards which employ electronically conductive adhesive compositions are provided. The composition comprises a solder powder, a chemically protected cross-linking agent with fluxing properties and a reactive monomer or polymer as the principal components. The compositions may also comprise three or more of the following: a relatively high melting metal powder; solder powder; the active cross-linking agent which also serves as a fluxing agent; a resin; a reactive monomer or polymer; and a metal additive. Compositions comprising metal powder are ideally suited for creating the conductive paths and vias on printed circuits.

32 Claims, 6 Drawing Sheets

Thru Hole Metallization Process flow Chart

Thru Hole Metallization Process flow Chart

BASIC REQUIREMENTS FOR THRU HOLE COATING PROCESS

MULTILAYER PRINTED CIRCUIT

This application is a continuation-in-part of Ser. No. 08/324,060 filed Oct. 17, 1994 which is a divisional of Ser. No. 07/769,892, filed Oct. 1, 1991, now U.S. Pat. No. 5,376,403, which was a continuation-in-part of Ser. No. 07/477,678 filed Feb. 9, 1990, now abandoned.

BACKGROUND OF THE INVENTION

The present invention relates to multilayer printed circuit boards. Multilayer printed circuit boards are generally known. See, for example, U.S. Pat. Nos. 4,921,777, 4,897,338, 4,642,160, 4,645,733, and 3,791,858. Prior art methods of fabricating multilayer circuit boards, however, are deficient in a number of respects. In addition, as related to the fabrication of multilayer printed circuits requiring high circuit densities, the prior art methods are deficient in a number of respects including difficulty in producing circuitry of extremely high density, such as circuitry requiring vias smaller than 250 microns, the expense of producing multiple layers through lamination, the need to drill many small holes through the liminates to achieve electrically interconnecting vias, the difficulties involved in plating via holes, the long plating times required to plate the vias.

To address these short comings, a variety of alternatives to standard print and etch technology have been explored. Several of these alternatives are "additive" printed wiring board techniques employing electrically conductive particle filled polymer compositions commonly referred to as polymer thick film (PTF) inks. Although the additive printed circuit board techniques mitigated several of the deficiencies in conventional multilayer printed wiring board fabrication, the PTF's previously known in the art suffer from poor reliability and inadequate performance as detailed in U.S. Pat. No. 5,376,403.

It is an object of the present invention to provide methods for fabricating multilayer printed circuit boards wherein etching or plating is not required to achieve electrically interconnecting traces and vias or to achieve solderability. It is also an object of the invention to provide cost effective methods for producing multilayer printed circuits having very high interconnection densities. It is also an object of the invention to provide conductive adhesive compositions and methods which overcome the deficiencies of the prior art.

SUMMARY OF THE INVENTION

One aspect of the invention is directed to a method of preparing a multilayer printed circuit board which comprises the steps of:

(a) forming a first dielectric layer on a surface of a substrate wherein the first dielectric layer includes one or more first conductor grooves;

(b) applying a first conductive ink composition into said first one or more conductor grooves;

(c) heating the first conductive ink composition to a temperature and for a period of time sufficient to cure the first ink conductive composition whereby the cured first conductive ink composition forms first conductive traces;

(d) forming an insulating layer on the surface of said first dielectric layer wherein said insulating layer includes one or more vias;

(e) applying a second conductive ink composition into said vias;

(f) heating the second conductive ink composition to a temperature and for a period of time sufficient to cure the second ink conductive composition whereby the vias filled with the cured second conductive ink composition are in electrical contact with one or more of said first traces;

(g) forming a second dielectric layer on the surface of said insulating layer wherein the second dielectric layer includes one or more second conductor grooves;

(h) applying a third conductive ink composition into said second conductor grooves;

(i) heating the third conductive ink composition to a temperature and for a period of time sufficient to cure the third ink conductive composition whereby the cured third conductive ink composition forms second conductive traces that are in electrical contact with one or more of said vias.

In another aspect, the invention is directed to method of preparing a multilayer printed circuit board which comprises the steps of:

(a) depositing a first conductive ink composition onto the surface of a substrate which defines a first circuit pattern;

(b) curing said first conductive ink composition;

(c) depositing a first dielectric material on the surface of said first circuit pattern so as to define one or more vias that are not coated with said first dielectric material;

(d) depositing a second conductive ink composition onto the surface of said first dielectric material and into said one or more vias, wherein the second conductive ink composition defines a second circuit pattern that is in communication with said one or more first vias; and (e) curing said second conductive ink composition.

In a further aspect, the invention is directed to method of preparing a multilayer printed circuit board which comprises the steps of:

(a) providing a plurality of substrates wherein each substrate defines one or more openings;

(b) coating the surfaces of said openings with a conductive ink composition by wherein the one or more openings defines one or more vias;

(c) forming a patterned layer of conductive ink composition on a surface of each substrate;

(d) aligning the plurality of substrates;

(e) laminating the substrates with sufficient pressure to cause the conductive ink composition from the patterned layers to fill said one or more vias; and (f) curing the conductive ink composition.

The electrically conductive adhesive compositions comprises in the most general terms a solder powder, a chemically protected cross-linking agent with fluxing properties and a reactive monomer or polymer, Depending upon the intended end use, the compositions comprise three or more of the following: a relatively high melting metal powder (hereinafter, metal powder); the aforementioned lower melting point metal powder (hereinafter, solder powder); the aforementioned active crosslinking agent which also serves as a fluxing agent; a resin; and a reactive monomer. The compositions comprising metal powder are ideally suited for creating the conductive paths on printed circuits.

BRIEF DESCRIPTION OF THE DRAWINGS

The invention may be better understood with reference to the accompanying drawings, in which.

DETAILED DESCRIPTION OF THE INVENTION

Figure 1:
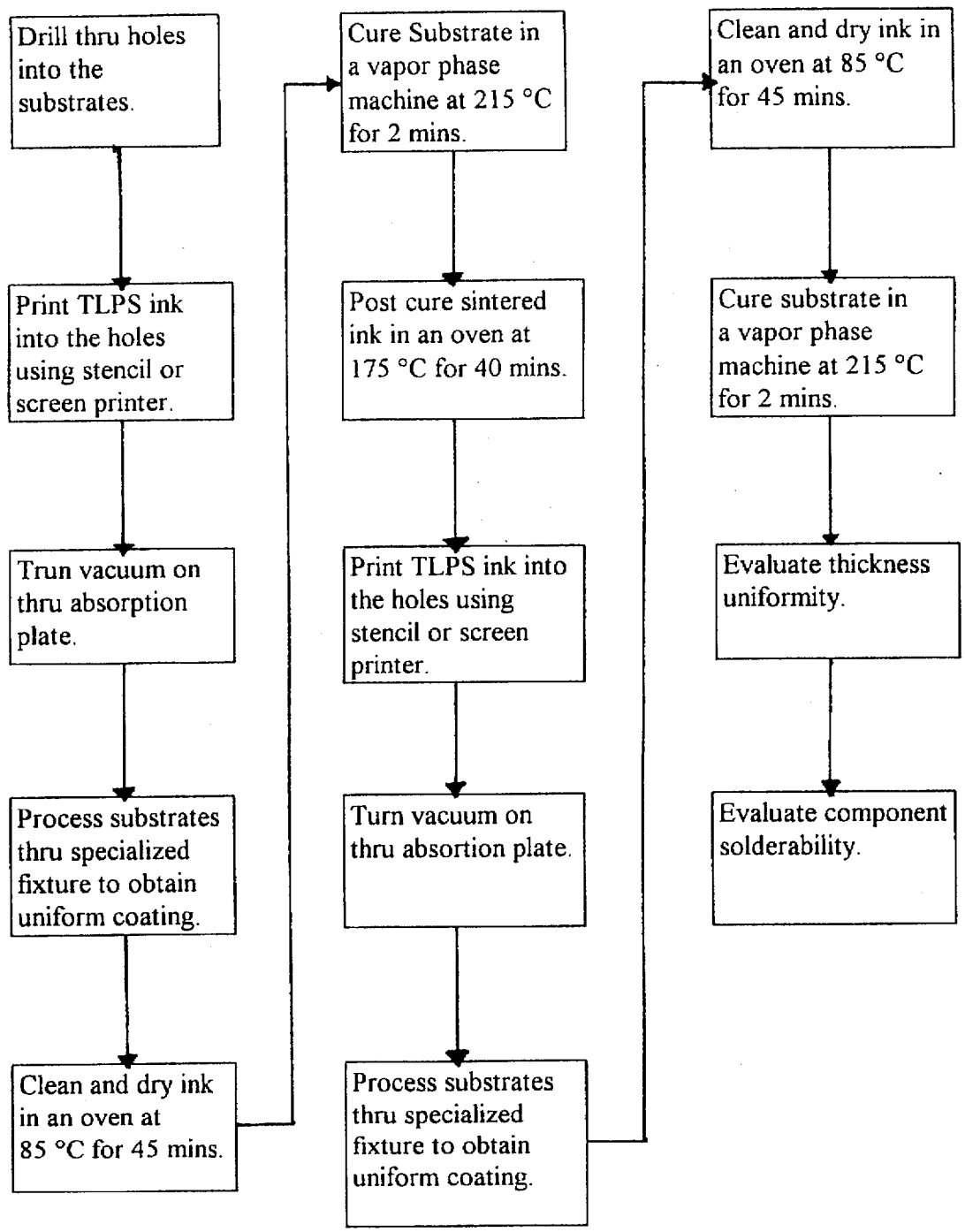
FIG. 1 is a through hole metallization process flow chart showing fabrication sequence and various process parameters for drying and sintering of TLPS ink.
Figure 2:
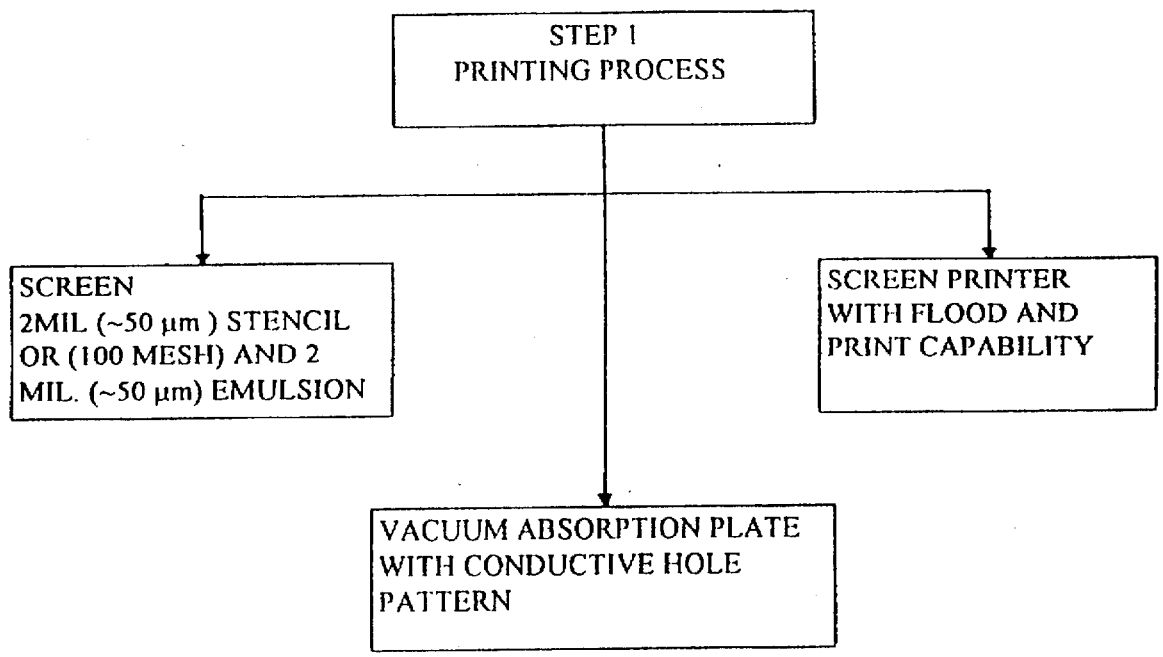
FIG. 2 is the basic requirements for through hole metallization printing chart identifying tooling and equipment necessary to achieve the task.
Figure 3:
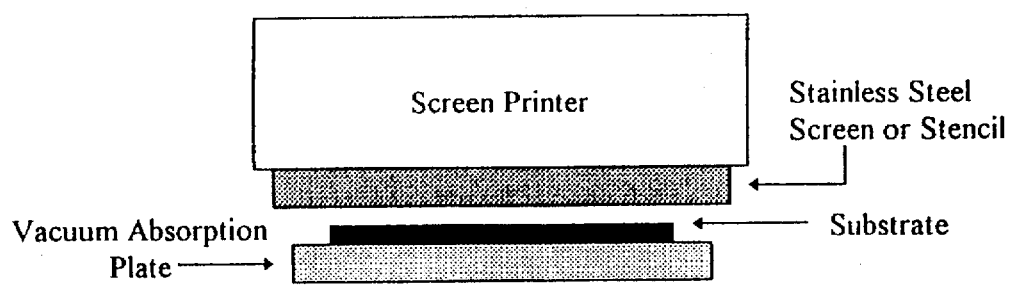
FIG. 3 is a standard schematic set up for various tooling indicated under "Step 1 Printing Process" of FIG. 2.
Figure 4:
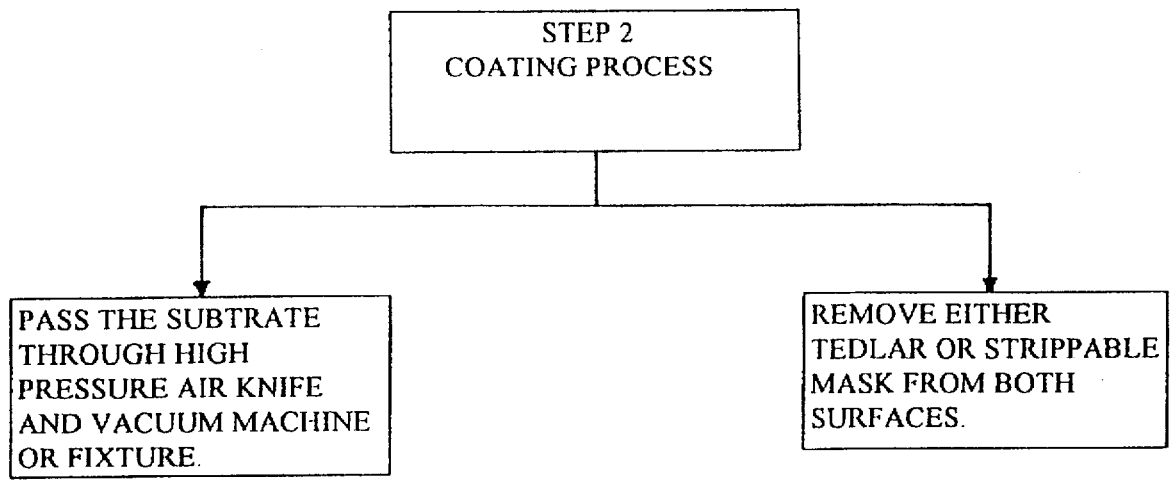
FIG. 4 is the basic requirements for through hole coating process chart identifying process principles.
Figure 5:
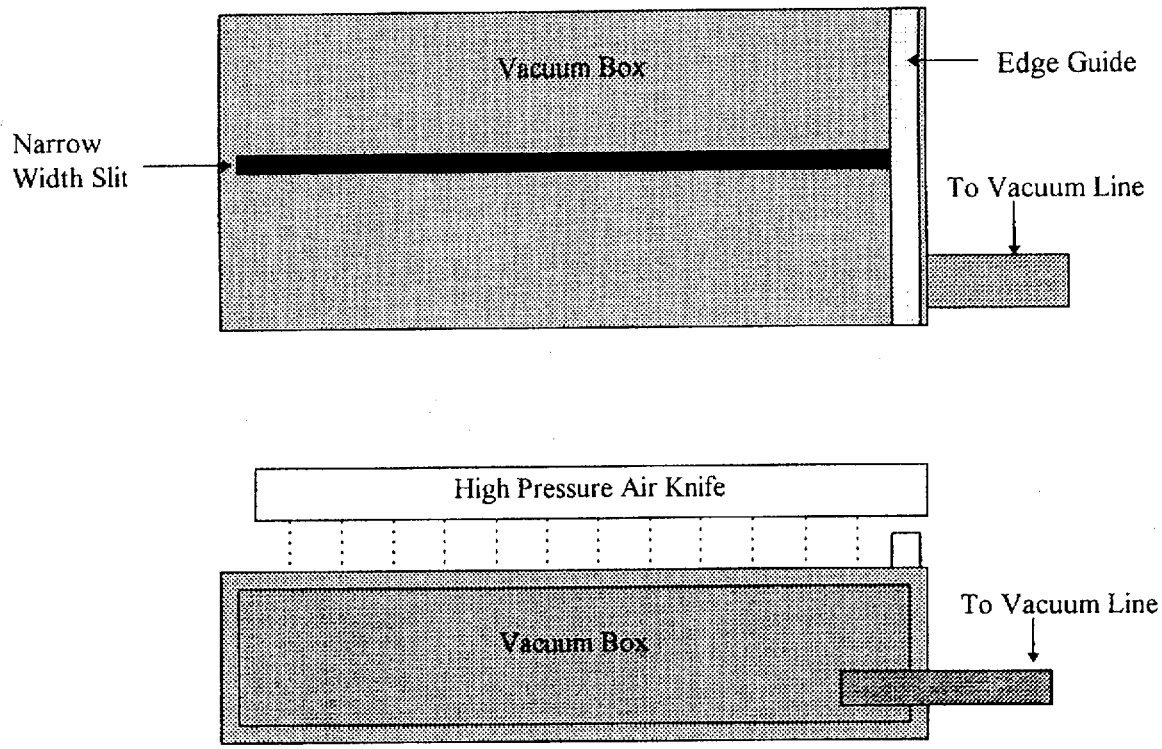
FIG. 5 is a tooling schematic for the coating process of FIG. 4.
Figure 6:
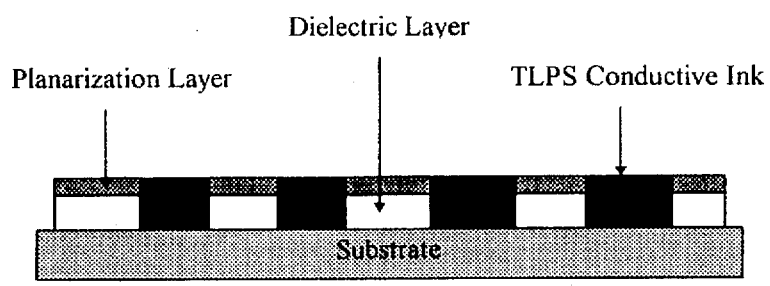
FIG. 6 is a cross section of a planarized circuit.

The present invention is based in part on the use of a novel conductive adhesive composition that has the following advantageous properties:

(a) a bulk electrical conductivity approaching that of solid copper (never achieved with the previous compositions);

(b) good solderability of the cured compositions;

(c) adhesive strengths comparable to copper clad FR4 epoxy printed circuit board laminates; and (d) highly corrosion resistant final products with resistance to degradation at high temperatures and relative humidities.

It had not heretofore been possible to achieve this combination of properties in a single composition.

As an additive material, the compositions of the present invention offer many desirable characteristics. The electrical conductivity of the inventive compositions are superior to the known conductive polymer thick films: conductive polymer thick films generally incorporate high levels of silver or copper particles into a thermosetting or thermoplastic resin binder and rely upon mechanical contact of these particles to carry electrical current. The inventive compositions employ a high melting point metal and a relatively low melting point alloy which undergo a process known as transient-liquid-phase sintering (TLPS) to form true metallurgical joints between the metal particles. TLPS is characterized by raising a low melting point metal or alloy to its melting temperature at which time it diffuses into a higher melting point metal or alloy. The new alloy thus formed solidifies as it is created and has an entirely new melting point. Judicious choice of metals employed in the TLPS process can allow for a composition that will remelt at substantially higher temperatures than the melting point of the original low melting point alloy. This property has been exploited in the inventive compositions thus allowing them to be utilized in multiple sequentially processed layers and in standard soldering operations without the remelting of the originally formed metal matrix in the composition. Unlike prior art polymer thick films, moreover, the inventive compositions are generally solderable. The compositions may be screen printed with higher precision than typical solder pastes. Unlike typical solder pastes, they exhibit less of a tendency towards formation of solder "satellites" and bridging. After curing, no cleaning or washing for flux removal is required.

The adhesion properties, mechanical integrity, and corrosion resistance of the compositions of the invention are far superior to those of previous compositions, because there is no need to add aggressive fluxing agents. The compositions are fully cross-linked, and all components thereof are chemically immobilized upon curing. Even the reaction by-products of the flux de-oxidation of the metals seem to be chemically bound in the polymer matrix. The presence of the reactive monomer in the composition controls the rate of curing of the resin ensuring strong adhesion of the composition to the circuit board substrate upon curing. With certain formulations, soldering to the cured composition is possible.

In general terms, the electrically conductive adhesive compositions comprise two primary components: a low melting point metal or metal alloy powder and cross-linking agent mixture comprising a protected curing agent, which also acts as a primary fluxing agent. Depending upon the intended end use, the preferred compositions of the invention contain three or more of the following:

(1) Optionally, a high melting point metal or metal alloy powder;

(2) A low melting point metal or metal alloy powder (solder);

(3) Optionally, a resin;

(4) A cross-linking agent mixture comprising a protected curing agent, which also acts as a primary fluxing agent;

(5) Optionally, a reactive monomer or polymer which can be cross-linked by the curing agent (hereinafter referred to as the "monomer"); and (6) Optionally, a metal additive.

The compositions frequently also contain at least one solvent; they may also contain other additives to improve certain properties such as adhesion heology or solderability. The composition must either contain (3) and/or (5), or alternatively (3) and/or (5) may be combined with (4) into a single species, as in the case of a protected homopolymerizable resin.

In preparing the composition, the proportions of components (1)–(6) plus a solvent may be varied over a considerable range and still yield an electrically conductive material once cured. Measurable electrical conductivity can be achieved with component (1) comprising from 0–65% of the volume of the composition (0% being the case of a composition useful as a solder paste). Similarly, component (2) comprises from 6–65% by volume of the composition. Component (3) comprises from 0–45% of the composition by volume (0% being the case of a solder paste which requires no adhesive). Component (4) comprises 0.0–61% of the composition by volume. Component (5) comprises 0–50% of the composition by volume. Component (6) comprises 0–10% of the composition by volume. (Volume percentages are measured without solvent.) Some of the compositions within these ranges exhibit some shrinkage and cracking or balling when cured; however, they remain useful as conductive adhesives in applications where these characteristics are harmless, such as in attaching components to electrical circuits.

Preferably, the composition after curing has a bulk electrical resistivity of less than $10^{-4}$ Ohm-cm. This electrical conductivity range can be satisfied by numerous formulations having components (1)–(6) within the following ranges:

Component (1): 13–65% of the volume of the composition;

Component (2): 6–29% by volume of the composition;

Component (3): 0–15% by volume (values near 0% being compositions useful as solder pastes);

Component (4): 7–60% by volume;

Component (5): 0–32% by volume;

Component (6): 0–10% by volume.

Some of the compositions within these ranges may exhibit shrinkage and cracking or balling when cured, but they remain useful as conductive adhesives in applications where these characteristics are harmless.

Most preferably, the composition has a bulk electrical resistivity of approximately $3 \times 10^{-5}$ Ohm-cm or less. These characteristics can be satisfied by numerous formulations having components (1)–(6) within the following ranges:

Component (1): 25–60% of the volume of the composition;

Component (2): 8–29% by volume of the composition;

Component (3): 0–12% by volume (values near 0% being compositions useful as solder pastes);

Component (4): 7–45% by volume;

Component (5): 0–28% by volume;

Component (6): 0–5% by volume.

While again some of the compositions within these ranges may exhibit shrinkage and cracking or balling when cured, they remain useful as conductive adhesives in applications where these characteristics are harmless.

Typically, the high melting point metal powder (1) is copper powder; however, other metals such as silver, aluminum, gold, platinum, palladium, beryllium, rhodium, nickel, cobalt, iron, molybdenum and high-melting point alloys of these metals, may alternatively be employed. Preferably, the copper powder is spherical or nearly spherical as produced by gas atomization.

A spherical powder containing a wide distribution of particle sizes distributed approximately normally about an average particle diameter is preferred over monosized spheres. The wide distribution of sizes increases the density of the packed metal powder as compared to monosized spheres, improving electrical conductivity and mechanical integrity. The powder generally has an average particle diameter of 1 to 50 microns. The preferred powder has a mean particle diameter of 1–25 microns.

The solder powder may be Sn, Bi, Pb, Cd, Zn, Ga, In, Te, Hg, Tl, Sb, Se, Po, or an alloy or other metal having a melting point lower than that of the metal powder in (1). Typically, the powder has a mean particle diameter of 1–40 microns; preferably, the average particle diameter is less than or equal to the average diameter of the high melting point metal particles and the particle size distribution is substantially the same as that of the high melting point metal powder. The principal requirement of the alloy is that it flow in the composition before the vitrification of the polymers in the composition. In order for this to occur, the solder alloy must readily wet the high melting point metal. For this reason, alloys of tin are ideal. Preferably, the solder powder consists of Sn and Pb.

The resin functions principally to adhere the cured composition to the substrate, to provide chemical binding sites for the reaction products after curing, and to increase the cohesive strength of the cured composition. The resin also functions as a medium for delivering flux to the metal powder, as a thickening binder for the composition. In order for the composition to achieve the highest electrical conductivities it must achieve and maintain low viscosity up to the temperature at which the solder powder melts and wets the high melting point metal. If the resin becomes too thick before the solder powder has melted, it will impede the flow of the melt and reduce the degree of metal powder soldering. For this reason, the curing of the resin must occur slowly relative to the time required to reach the melting point of the solder powder.

The resin (3) may be any resin which can be cross-linked by the curing agent, a metal catalyst, or a hydroxyl group-bearing agent. Resins which meet this requirement include but are not limited to epoxies, phenolics, novalacs (both phenolic and cresolic), polyurethanes, polyimides, bismaleimides, maleimides, cyanate esters, polyvinyl alcohols, polyesters, and polyureas. Other resin systems may be modified to be cross-linkable by the curing agent, a metal catalyst, or a hydroxyl group-bearing agent. Examples of such resins are acrylics, rubbers (butyl, nitrile, etc), polyamides, polyacrylates, polyethers, polysulfones, polyethylenes, polypropylenes, polysiloxanes, polyvinyl acetates/polyvinyl esters, polyolefins, cyanoacrylates, and polystyrenes. Typically, any resin would function in this invention if the resin can be modified to contain at least one of the following functional groups: anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, sulfonic esters/acids or other functional groups known to one skilled in the art to act as reactive sites for polymerization. For example, a polyolefin would not be suitable as a resin in this invention, as it has no reactive sites for binding and has poor adhesive properties; however, a carboxylated polyolefin functions well when matched with a suitable cross-linking agent. A combination of these and other resins, such as non-cross-linkable thermoplastic resins, may also be used as component (3). Presently preferred is a multifunctional epoxy resin, combined with a phenolic epoxy resin.

The principal feature of the cross-linking agent is that in its unprotected form it acts as an acid or a strong base. Most acids and strong bases function well as fluxing agents, because they can remove oxides from metals. However, if they are left in their reactive form in the composition they would prematurely cross-link the resin or consumed in reactions with the metal powders. The principal property of a protected curing agent in this invention is that it remain largely unreactive until it is needed to flux the metal powder and cross-link the resin. Protection may be achieved by chemically binding the agent with a chemically- or thermally-triggered species so that it becomes reactive only at or near the time that the solder powder melts. Protection may also be achieved mechanically, for example by encapsulating the curing agent in a shell of non-reactive material which releases the curing agent only at or near the melting time of the solder powder.

Cross-linking agents (4) known in the an include anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, or other agents known to those skilled in the art to cure polymers and to be acidic or strongly basic. Protecting groups are generally specific to the curing agent employed and are not generally applicable to all curing agents. Typical protecting groups include carboxylic acids, amides, alcohols, alkyl halides, acid halides, thiols, ureas, alkyl silanes, diazoalkanes, olefins, amines, amine-ols, and diamine polyols. In addition, curing agents may be protected by formation of azomethanes, acetals, ketals, transition metal complexes, or other curing agent precursors. There exist many such protecting groups and complexes specific to the curing agents being protected.

A presently preferred cross-linking agent (4) comprises a mixture containing a mono- or polyanhydride. Phthalic anhydrides are preferred. It is of particular importance that the majority of the anhydride be protected from reacting with the resin (3) and metal powders (1) and (2) until the flow temperature of (2) is reached. This can be accomplished, for example, by chemically binding a protecting or inhibiting group on the anhydride. The protecting group is preferably selected so that the protected anhydride becomes reactive at elevated temperature. A method of protecting the anhydride is to esterify it with an alcohol or polyol to form the mono-ester acid and its derivatives, as follows:

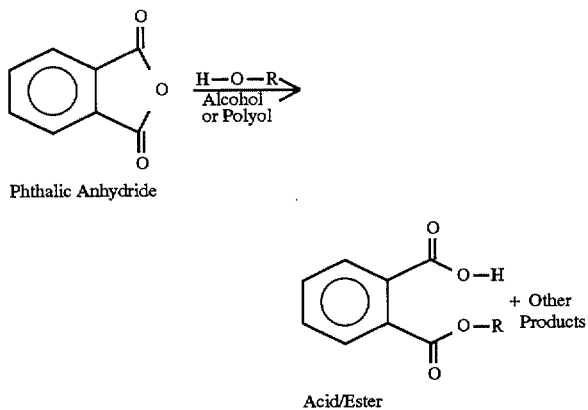

Butyl carbitol, methanol, ethylene glycol, glycerol, meso-erythritol, adonitol, and sorbitol are some examples of esterifying alcohols and polyols which can be employed. The resulting mono-esters acids formed can be further protected by buffering with a base, such as a tertiary amine, at room temperature. In addition, other protecting groups as are well known to those skilled in the art may also be employed.

Glycerol is a preferred esterifying polyol, producing a composition that achieves optimum electrical conductivity at moderate temperatures. The preferred anhydride ester is (2,3-dihydroxypropyl) hydrogen phthalate, which is suitably prepared by heating phthalic anhydride in glycerol at 180°–200° C. in the presence of a trace of acid or water until the concentration of the mono-ester reaches equilibrium. The resulting mixture comprising anhydride, mono ester-mono acid, diacid and other reaction products may then be buffered with a base as described above, or may be directly employed as the cross-linking agent/flux in preferred compositions. A preferred buffering agent is triethanolamine.

It is believed that the esterified anhydrides and buffered esterified anhydrides are chemically triggered at elevated temperatures and/or by interaction with the metal oxides. The anhydride and its protecting groups are selected to chemically attack the oxides on the surface of the metal particles in an aggressive manner, yet remain non-reactive after curing. The metal oxides are apparently chemically immobilized in the resin system after curing, preventing them from forming caustic salts and acids. Furthermore, the aggressiveness of the cross-linking agent in attacking the metal oxides can be altered chemically, through selection of the cross-linking agent and its protecting group, and tailored to fit both the melting point of the solder (2) and the type of metal (1) to be fluxed.

The reactive monomer (5) functions to adhere the cured composition to the substrate, to provide chemical binding sites for the reaction products after curing, and to increase the cohesive strength of the cured composition. The monomer also may function as a medium for delivering flux to the metal powder, as a thickening binder for the composition, and as a medium for decreasing the glass transition temperature of the cured composition if desired.

The monomer may be any species, monomeric or polymeric, which may be cross-linked by the curing agent, a metal catalyst, or a hydroxyl group-bearing agent. Generally, they are distinguished from resins by having relatively low molecular weights. The preferred reactive monomer (5) contains at least one functional group, and preferably two or more functional groups, as reactive site(s) for linking with the cross-linking agents and the resin. Typical functional groups include, but are not limited to, epoxides, amides, amines, alcohols, allyls, acrylates, methacrylates, cyanate esters, and maleimides. —OH groups in the monomer may also serve as antioxidants for the metals during the high temperature curing of the composition. A preferred reactive monomer is Bisphenol A.

The optional metal additive can be added as separate particles, as a coating on the high melting point metal (1) or the low melting point alloy (2), or pre-alloyed with (1) or (2). The preferred size of particulate additives is 0.1–50 µm. The metal additive can be any metal chosen from the group consisting of boron, aluminum, chromium, iron, nickel, zinc, gallium, silver, palladium, platinum, gold, indium, antimony, bismuth, tellurium, manganese, phosphorous and cobalt. During processing, the conductive compositions described herein undergo a transient liquid phase sintering (TLPS) reaction. The TLPS reaction is characterized by raising the temperature of a low melting point metal or alloy to above its melting point to form a liquid which subsequently diffuses into another, solid metal. In TLPS, the new alloy thus created has a higher melting point than the original low melting point metal or alloy. The new alloy solidifies as it is formed and will only remelt at a new melting temperature characteristic of the alloy formed. In the conductive compositions described herein, the TLPS reaction allows the high melting point metal (1) and the low melting point metal or alloy (2) to form a metallurgically connected matrix. It is believed that the additive metals alter the grain structure, extent, and rate of formation of the matrix formed between (1) and (2) during processing of the conductive ink compositions. It is further believed these structural alterations provide a wide variety of benefits to the composition for specific applications, such as promoting greater flexibility. Currently preferred metal additives include silver, nickel, gallium and gold.

After curing, soldering electronic components is observed to be possible with certain formulations. Scanning electron microscope data of preferred conductive compositions indicate that, after cure, the polymer matrix resides primarily at the substrate interface and bottom portion of the metal matrix. It is currently believed that this migration of the organic materials allows the surface of the metal matrix to interact with solder without inteference from the polymer. It is further believed that solderability of the conductive compositions is a function the wettability of the metallurgy in the metal matrix by the solder alloy employed, and the microscopic morphology of the cured composition.

The electrically conductive adhesive compositions of the present invention are suitably obtained by first preparing the cross-linking agent. Typically, the cross-linking agent is prepared by combining a 1:4 molar ratio of the anhydride with glycerol (or other protecting molecule). This mixture is heated while being mechanically stirred to 180° C. under nitrogen to effect esterification. The completeness of this reaction may be followed by using infrared spectroscopy. A sharp singlet band at 1800 cm$^{-1}$ will disappear as the reaction proceeds and be replaced with a broad singlet band at approximately 1740–1750$^{-1}$ cm. The esterification of tetrabromophthalic anhydride with glycerol is complete in approximately 2–4 hours under these conditions.

The organic constituents are now intermixed at room temperature to produce a thin resinous mixture. Since the metal powder may take part in the polymerization reaction with this resin system, and since some of the reactants will be consumed in removing the oxide from the metal powder, it is necessary to determine the ideal stoichiometry for a given set of reactants empirically through measurements of physical and electrical characteristics of the composition such as resistivity, adhesion strength, and solderability of the final cured composition as a function of concentration of each component.

Next, the metal powder, solder powder, and the optional metal additive are mixed in the desired proportions as indicated above. The metal powder mixture is then blended with the resinous mixture to produce a thick composition. Additional solvent may be added to achieve the desired viscosity for the intended application.

To make a printed circuit using this composition, an insulating substrate should first be degreased and dried near 100° C. to expel any absorbed moisture. Additional surface preparation techniques such as, but not limited to mechanical abrasion, chemical etch, and plasma etch may be employed. The composition is applied to the substrate in the desired pattern of a printed circuit. In a preferred approach, the composition is screen-printed onto the substrate which is then heated. As noted previously, the heating temperature should be selected with consideration for the curing temperature of the resin and the temperature range within which the solder powder melts. Ideally, the substrate material is compatible with the adhesive in the composition to produce a good strong adhesive bond. In the case of the epoxy resin composition described here, good adhesion can be achieved with such substrates as PEI and epoxy FR4.

Ideally, heating is done in a stepped temperature oven. First, the printed substrate is warmed to a temperature below the cure temperature of the ink to evaporate the solvent. When completely dry of the solvent, the temperature should be rapidly raised to the melting point of the solder (2). At or near this temperature, if the reactants have been properly selected and compounded, the cross-linking agent is activated to react with the metal powder and remove the oxides. Also at this temperature, the reactive monomer reacts with the cross-linking agent and the metal oxide so that the net result is a rapid de-oxidation of the metal particles, a wetting of the oxide free surfaces of the metal particles by the now molten solder, and the beginning of vitrification of the resin surrounding the metal particles. These reactions take only a few seconds.

Subsequently, the oven temperature is maintained at the cure temperature of the epoxy to fully harden the system. The entire reaction can occur in from as little as 10 seconds to as much as several minutes depending on temperatures and concentrations chosen. Post cure heating below this same temperature for several hours may be necessary to achieve final cure of the composition and optimal adhesion, depending on the resin and curing agent, resin and substrate employed.

The printed circuits obtained using this composition as described demonstrate excellent conductivity and adhesion to the substrate. They do not lose conductivity over time, and they can be soldered. Nor do they corrode in humid environments. Compositions made using this invention overcome many of the limitations of the prior art and make the technique practical for manufacturing functional printed circuits.

Additives to enhance the properties of these compositions to meet specific requirements may also be employed. Adhesion promoting agents, wetting agents, and viscosity modifiers are only a few of the additives which may be used at low levels to improve properties without significantly altering the conductivity of the material. A variety of flexibilizing agents may also be added to these formulations to increase the material's flexibility. Flexible resins such as Shell's EPON 872-X-75 or DOW's DER-736 can be used to increase flexibility of the cured product.

Fabricating Circuits

Conductive compositions as described herein are advantageously employed in the creation of printed circuits. One method for creating such a circuit comprises first making a printing screen or stencil containing the pattern of the desired printed circuit. The processes and apparatus for screen printing and stencil printing are well known to those skilled in the art. The screen is then used in a screen printing apparatus to print multiple copies of the printed circuit on the substrates selected. Such substrates may consist polyimide, phenolic, epoxy, BT-epoxy, cyanate ester, or other thermoset laminates. The substrates may be rigid or flexible. Alternatively, the substrate may be injection molded or extruded sheet of polyetherimide, polyethersulfone, polyetherketone, polyarylsulfone, liquid crystal polymer, or other thermoplastic. Other substrates may be used, including ceramics, insulated metal sheets, glass, quartz, graphite or any other material to which the composition can be adhered and which can withstand the curing temperature.

After printing the uncured composition in the pattern of the desired printed circuit on the substrate, the composition is then cured by application of heat. A static oven may be employed, but a conveyorized oven with multiple heating stages is preferred. The conveyorized oven's heating method may be infra-red lamps, panel heaters, convection, forced hot air, induction, vapor phase condensation, microwave, or other known heating method. Such ovens are well known to those skilled in the art. The multiple heating stages may then be used to heat, dry, cure, and then cool the composition in a controlled way, minimizing pinholes caused by outgassing, eliminating damage due to severe temperature changes, and achieving complete curing. Holes may be drilled or punched in the printed circuit thus obtained, as in a conventional circuit board. Components may be soldered to the printed circuit with a solder wave, soldering iron, hot air gun, or solder paste reflow, all common techniques well known in the art. Alternatively, components may be adhered to the printed circuit using an application specific version of the composition itself. This is accomplished, for example, by placing the components in the composition prior to curing. This has the advantage of eliminating the soldering operation and subsequent solder flux cleaning operations entirely. Yet another method for adhering components is to first cure the printed circuit, then apply an additional amount of uncured composition as a conductive adhesive for bonding the components.

Fabricating Multilayer Circuits

Multiple-layer printed circuits may be made by starting with a circuit board made as above. Over the cured ink, a thin layer of a thermosetting dielectric resin can be applied with a screen or stencil printer. The layer applied should be patterned so as to allow vias or passages that remain uncoated with insulating material. After curing of this layer, a second layer of conductive ink may be printed over the insulating layer. The vias or passages would then allow electrical interconnection between the upper and lower layers. In this fashion, a two-layer printed circuit is made. The process may then be repeated sequentially multiple times to create a printed circuit containing many layers. Solder mask may be applied over the final conductor layer as in conventional printed circuits.

Printed conductive inks have a thickness of approximately 25 μm and sequentially adding layers builds up surface irregularities. This makes circuit printing successively more difficult with each layer printed. To avoid this a planarization process described herein was developed to minimize the effect of surface irregularities caused by multilayering. This process prints a reverse image of the preceding metal layer with a dielectric material. The planarization layer builds up the surface between the traces without adding additional height to the metal. After this planarization layer is printed, two dielectric layers are printed to minimize the chances of any pin holes. Both the planarization and dielectric layers can be applied using screen printing stenciling, roller coating, curtain coating, dry film lamination, or by other methods known to those skilled in the art. These two layers of dielectric should be patterned so as to allow vias or passages which remain uncoated. These vias or passages would then allow electrical interconnection between the upper and lower layers. In this fashion, a two-layered printed circuit is made. The process may then be repeated multiple times to create a printed circuit containing a plurality of layers. Electronic components may then be attached as described before.

When open conductive through holes are desired in circuits fabricated in this manner, the following process can be used. A screen/stencil printing process is employed to deposit conductive material into said holes in the base substrate prior to fabrication of the multilayer circuit. Deposition is followed by a vacuum process to uniformly distribute said material over entire surface of said holes. This can be accomplished by using a conveyer system and a vacuum fixture with only a small slit and a supplemental air assist. The printed circuit board with through-holes filled using a screen/stencil printing process or doctor blade is then placed on a continues conveyor system and carried onto the vacuum fixture where the unneeded conductive material is pushed and drawn through the small slit into a holding reservoir (where it can be recycled) it is then rotated 90° using the same conveyer system and translated onto a second vacuum fixture where the process is repeated. This can also be achieved by using a vacuum fixture with holes matching that of the printed circuit board and a supplemental air assist to both draw and push excess conductive material through the hole pattern. As the multiple layers of circuitry and dielectric are subsequently applied, blind vias for each interconnect layer will be filled to allow for electrical connection to the coated vias in the base substrate. After each layer of conductive ink is applied it is generally dried and cured as stated previously. Post curing of each layer may be accomplished at the end of the multilayering process.

The above method for producing multilayer circuits is limited to approximately 150 μm trace widths. The principal limitation is the screen employed in the process. An alternative method for creating a multiple-layered printed circuit board which overcomes this limitation uses a screenless printing process and commercially available photoimageable dielectric materials, producing traces down to 25 μm. First the photoimageable dielectric is applied to the base substrate. If the dielectric is in a dry film form, it is laminated to the substrate. If the dielectric is in a solution form, it is applied by screen printing, curtain coating or sprayed onto the substrate and dried, or any other means known to the art. The coated substrate is then exposed to visible or UV light through a right reading mask containing the desired circuit pattern to selectively crosslink the material. The sample is then washed with an appropriate solution to develop the un-crosslinked polymer/dielectric, leaving the final photoexposed, cross-linked polymeric/dielectric with the desired conductor pattern. The result is a hard dielectric coating on the substrate containing the circuit trace pattern in the form of grooves. Another method of producing these grooves would be to use a computer programmed laser to cut (ablate) the desired circuit pattern into the dielectric.

Following the formation of the grooves, the conductive ink is applied. This is accomplished by screen printing or doctor blading the ink over the patterned polymer film, thereby filling the grooves. A stencil with the same image as the circuit pattern can be used to minimize clean-up of excess ink, but it has no effect on the ultimate printing resolution. The circuit is then thermally cured as described previously.

A second layer of photosensitive dielectric can then be applied and exposed to a mask containing the pattern of the vias. After developing, the vias are filled with conductive ink and cured as before. A third layer of photosensitive dielectric can then be applied. This layer is then exposed, developed, filled and cured with the circuitry for the second conductor layer. In this fashion a two layer circuit has been produced. The process can be repeated sequentially to produce any multilayer structure. With this technique, the resulting circuits are thin and co-planar in profile with the dielectric layer. Each layer is the thickness of the photosensitive dielectric layer.

Metallic Substrates

Multilayer circuits can be fabricated by the methods described above on a variety of substrates. One of the advantages of this additive approach to producing circuits is that it is possible to build up single and multilayer printed circuit boards on metal substrates. To do so, a layer of insulating material must be applied to the metal before subsequent printing of conductors and vias. One method is to employ a thin layer of polymer such as epoxy or polyimide to insulate the metal. This is effective where heat transmission to the substrate is not essential. For improved heat conduction, the filling of the polymer with a thermally conductive powder such as alumina, aluminum nitride, or boron nitride will enhance thermal conduction for of the base substrate use as a heat sink.

An alternative method involves coating a thin layer of ceramic onto the metal to produce electrical insulation. The ceramic can be produced chemically on the metal by plating, etching, or anodization. An example is the anodization of an aluminum substrates to produce a thin insulating layer or alumina. Another method involves painting the substrate with a sol gel to produce after baking a thin layer a ceramic dissimilar to the underlying metal.

Electrically conductive through holes can be produced in the metal substrate by drilling or punching holes prior to application of the insulating layer. By carefully applying the insulating layer to the inside walls of the holes, it is possible to electrically isolate the substrate from a conductive ink subsequently applied to the interior of the holes as described above.

An important expansion of the scope of current work is to develop techniques to produce laser or plasma drilled vias filled with conductive ink for use in high density multilayer multichip modules.

The technique proposed for laser drilling involves combining the ease of additive ink processes with laser-drilled dielectrics. In this approach, the laser drilled dielectric is used to create the pattern to the vias. The vias are then filled with the conductive ink using a variant of conventional stencil printing techniques. Eliminating the stencil and screen makes possible print resolution limited only by the resolution of the laser-drilled dielectric.

Using Plasma drilled substrates in conjunction with our conductive material high density fine line circuitry can be created. This can be achieved using a conventional copper clad laminate substrate. Using a photosensitive material, only the via holes are etched. The panel with the holes exposing the underlying insulator in then etched by a plasma or chemical process to produce tiny holes (down to approximately 25 μm) through the insulation layer without the need of drilling or punching (limited to approximately 100 μm). Subsequently, the holes are filled with conductive ink and cured. The desired printed circuit pattern is then etched by conventional methods into the copper cladding, resulting in a high density two layer circuit inter connected with tiny vias where desired.

Another copper clad laminate substrate can be laminated to the circuit created above. The process is then repeated to produce a four layer circuit and so on.

Finally instead of screen printing the traces and vias sequentially, it is possible to laminate films of the trace layers together with lamina consisting of films of insulating materials with holes punched or drilled in it for making interconnection. Prior to lamination, the holes can be coated or filled with conductive ink. Lamination of the multilayer structure with simultaneous application of heat will interconnect the conductive ink and traces providing metallurgical and electrical interconnection with the underlying and overlaying trace-bearing lamina.

Conductive compositions as described herein may also be employed to attach electronic components to conventional copper-clad printed circuits. In this application, the compositions make an excellent replacement for heretoforeknown solder pastes. The conductive compositions may be stencil- or screenprinted onto the lands of a completed copper-clad printed circuit in a manner known to those skilled in the art. The leads of electrical component are then placed on the conductive composition and the entire assembly may be cured in an infra-red oven, convection oven, or by vapor reflow, all methods well known to those skilled in the art. The inventive compositions advantageously eliminate the need for cleaning the printed circuit assembly after curing. Moreover, the formulation of the compositions are such that common problems with solder pastes, such as solder balling, bridging, and component tombstoning, are eliminated.

Yet another useful application for compositions of the present invention is in attaching bare microcircuit dies to substrates, as is commonly done in the manufacture of multichip modules. Suitable formulations for this purpose include thermoset adhesives which, once hardened, are difficult to remove without destroying the printed circuit. The compositions described herein may be formulated using resins comprising thermoplastic and thermosetting blends such that the cured compositions may be melted even after curing by application of moderate heat. In such applications, the conductive composition may be printed onto the substrate of the multichip module using screen- or stencil-printing as is known to those familiar with the art. The die is then placed on the composition and the assemble is heated in an oven as described previously to achieve curing. Alternatively, heat may be applied to the die from above by a hot platen or hot air blower to achieve curing. The resulting bond between die and substrate may be easily detached, if necessary, by application of heat to the die by a hot platen, soldering iron, hot air, or any other method known to one skilled in the art. The die may then by pulled away from the melted composition.

The invention may be better understood by reference to the following examples which are intended for purposes of illustration and are not to be construed as in any way limiting the scope of the present invention, which is defined in the claims appended hereto.

EXAMPLE 1

A multilayer circuit board may be created with the basic concept of having the holes pre-drilled on the bare substrate (substrate can consist of FR-4, paper phenolic, polyimides, etc.) The ink is then applied unto the holes using a stencil screen with the application of vacuum to pull ink from the bottom of the board while forced air pushes the ink out of the hole from the top side. This will leave behind a uniformly coated through hole. After the ink is applied, the ink is then dried and cured. The desired circuit traces may then be applied through screen printing on the bare substrate, and processed properly for curing. After this process the desired pattern of dielectric will be applied leaving holes exposed. This can be accomplished on both sides of the substrates. A second layer of ink traces may then be applied and cured properly, creating a 2 layer board. For metal substrates the same method is used but with the isolation of the dielectric application is first performed to avoid creating shorts with the conductive ink.

EXAMPLE 2

A multilayer circuit board created with the same concept as example 1, where a conductive ink is applied using a screen printer to the basic substrate with the desired patter, and dried and cured properly. A layer of dielectric is then applied and cured. A second layer of ink is applied with the required pattern, dried and cured at the proper temperature. This process is repeated until the desired layers are complete. The final step is then to have the board drilled and the ink is then applied using the proper tooling to coat the holes therefore making the desired connections.

EXAMPLE 3

Figure 7:
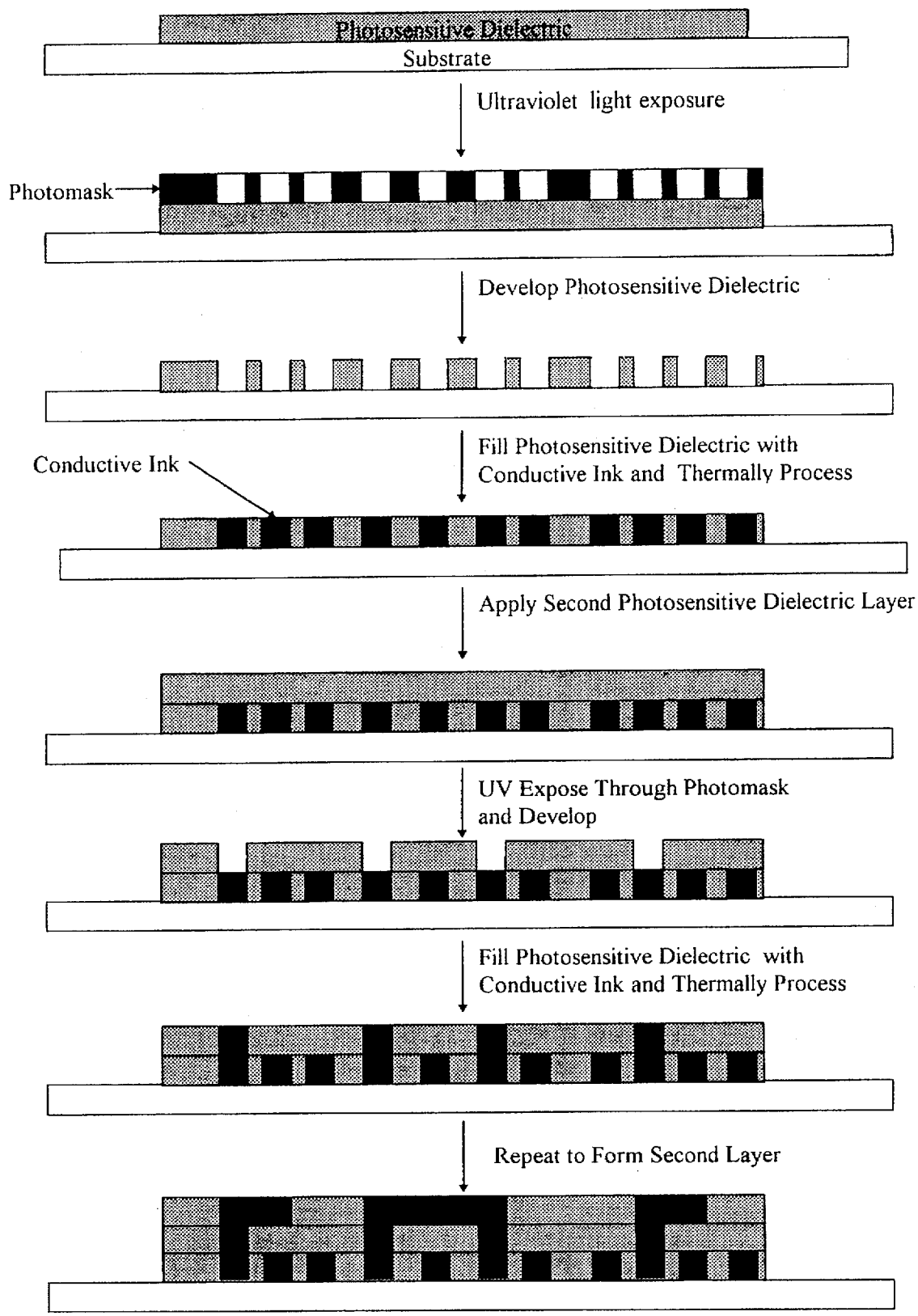
FIG. 7 is a series of cross sectional views of a step-by-step process for creating multilayer MCM fine line printed circuitry.

FIGS. 7A–7H demonstrates the build up of a multilayer board by using a dry film, or liquid photoimageable dielectric process. In this process a photosensitive dielectric is applied and imaged with the desired pattern. The conductive ink is next applied to fill the photoexposed conductor grooves. This can be accomplished by screen printing or doctor blading the ink over the desired pattern. The ink is then dried and cured. A second layer of photosensitive dielectric is then applied and exposed with the pattern of the vias. After development of the traces, the vias and the holes are filled with conductive ink and cured as before. A third layer of photosensitive dielectric is then applied. This layer is again processed in the same fashion with the desired circuitry. Therefore, creating a 2 layer structure. This fashion can be repeated to create multilayers. This procedure is especially beneficially for fine line applications. Traces as small as 50 μm and vias of 75 μm have been achieved.

EXAMPLE 4

Additive Metals

An experiment was performed to determine the ability of a third metal powder "dopant" to decrease the susceptibility of copper-tin intermetallic conductive traces to forming microcracks during thermal cycling. Several formulations were made up from a master pre-mixture containing (by volume) 32% copper powder, 12% eutectic composition tin-lead alloy powder, 13% phenolic monomer, 10% ester/acid oligomer, 3.5% aniline based tetrafunctional epoxy, 3.5% Novolac epoxy, 6% triethanolamine, and 20% butyl carbitol solvent. To several splits of this pre-mixture were added a variety of "dopant" metal powders at a level of 3–6% by weight of the total metal content. The splits containing the various dopant materials were screen printed in a serpentine pattern of 8, 10 and 12 mil lines. Each of the lines had a total length of 90 inches. The screen printed patterns were cured under standard conditions for such conductive compositions and were then subsequently cycled 5 times to 215° C. for 2 minutes. The number of resultant cracks in each sample were counted under backlit magnification. The results are as follows:

| Additive | Level of addition | Numbers of cracks |
| --- | --- | --- |
| silver | 3% | 29 |
| silver | 4.5% | 4 |
| silver + nickel | 6% | >100 |
| nickel | 6% | >100 |
| gallium | 3% | 42 |
| gallium + silver | 6% | 1 |
| aluminum | 3% | >100 |
| aluminum + silver | 6% | >100 |
| boron + silver | 6% | 55 |
| silver coated nickel | 6% | >100 |
| silver coated mica | 6% | 35 |
| aluminum-bronze | 6% | 7 |
| no additive | — | >100 |

The results demonstrate that the additive metal can have a substantial effect on the crack resistance and that of these additives, silver, gallium and bronze are the most useful.

EXAMPLE 5

An experiment was performed in which the ester was left out of several formulations and various other constituents were added or increased. The purpose of this experiment was to determine if the roles being played by the ester could be executed as effectively by substitute materials. As the ester is believed to being playing both fluxing and adhesive roles, both flux materials and epoxy constituents were increased to compensate. The experiment and the results are below:

All the samples were prepared using a master metal pre-mixture consisting of 70% by weight copper, 25% by weight eutectic tin-lead alloy, and by weight silver. 14.75 grams of the pre-mixture was added to each of the samples. For each sample, butyl carbitol solvent was added as necessary to produce a formulation with a screen printable consistency

| Constituent | Amount (g) Std | Sample 1 | Sample 2 | Sample 3 | Sample 4 |
| --- | --- | --- | --- | --- | --- |
| Phenolic monomer | .60 | .94 | .60 | .60 | .60 |
| Epoxy resin | .30 | .30 | .30 | .43 | .35 |

-continued

| Constituent | Amount (g) Std | Sample 1 | Sample 2 | Sample 3 | Sample 4 |
| --- | --- | --- | --- | --- | --- |
| triethanolamine | .25 | 0 | .25 | .43 | .43 |
| Ester/Acid oligomer | .45 | 0 | 0 | 0 | 0 |
| Bulk Resistivity (micro Ohm*cm) | 29.1 | * | 26.5 | 26.6 | 25.5 |
| Pull Strength (kg/4 mm$^2$) | 4.56 | 0 | .36 | .35 | .25 |
| Solderability | good | not | v.good | v.good | v.good |

Similar experiments have also been performed adding N-methylimidazole as a curing agent for the epoxy resins in the system in an attempt to increase adhesion. In all cases, it was impossible to simultaneously achieve the properties of electrical conductivity, adhesion and solderability which are possible with the ester oligomer.

EXAMPLE 6

Several 9"×12" unclad FR 4 (glass-epoxy) panels were drilled for process. A grid pattern of various hole sizes was designed based on PCB industry standards. The vacuum fixture was used to metallize through hole coatings for vertical interconnects. The following are the various hole sizes. Hole sizes:

1) 0.125"
2) 0.075"
3) 0.040"
4) 0.030"
5) 0.020"

Two types of TLPS conductive ink were used to metallize the through holes. The first type was used primarily to imprye adhesion to FR 4, while the second coat is basically for improve solderability.

Three viscosities of each formulation were prepared: 105,000 cps, 85,000 cps and 60,000 cps. Based on tests, it was determined that the ink with the viscosity of 60,000 cps gave the best results for this task. The charts and diagrams in the Figures show the step by step process.

After, the sample board through holes were coated with both inks using the same vacuum fixture and process, the samples were cross sectioned to determine the thickness variation that can be expected for this type of processing. The following table summarizes the data collected.

| Hole Size in inches | Average Coating Thk. TLPS in inches | Average Coating Thk. TLPS in inches | Thickness Variation in inches |
| --- | --- | --- | --- |
| 0.125 | 0.0025 | 0.0035 | 0.0035$^{\pm.0015}$ |
| 0.075 | 0.0023 | 0.0033 | 0.0033$^{\pm.0015}$ |
| 0.040 | 0.00135 | 0.00153 | 0.00153$^{\pm.0007}$ |
| 0.030 | 0.00140 | 0.00152 | 0.00152$^{\pm.0007}$ |
| 0.020 | 0.00107 | 0.00135 | 0.00135$^{\pm.0007}$ |

The analysis of the data indicates that as the hole size increased, the coating thickness also increased. This was easily understood when considering how air velocity through a hole under vacuum is generated. Due to the Venturi effect, the air velocity through a hole is inversely proportional to the size of the hole. Therefore, smaller holes will have a higher air velocity, leaving behind a thinner coating while larger size holes will have lower velocity, leaving behind a thicker deposit. The use of properly designed production equipment would eliminate this variability. Consequently, any size of vertical interconnect manufactured with this process, will exhibit the same uniformity and quality seen with the standard plated through-hole technique.

Several of the samples were further processed to simulate assembly. For this purpose, sample boards were populated with components and placed in a solder pot to simulate a wave solder process, using water washable fluxes. Results showed 100% wetting between the hole metallization and the component leads while the adhesion of the component leads to the substrate was excellent.

Additional samples were processed with hot air solder leveling (HASL) equipment and commercially available no-clean fluxes. This was done to evaluate the solderability of the through holes using HASL equipment. The results indicate inconsistent wetting under this condition. This inconsistent wetting was most probably due to flux incompatibility. Therefore, complete acceptance of this technology could depend on the development of a flux compatible with the HASL process.

Design Guidelines for Through-hole Metallization:
- Based on the data collected, it is recommended that starting hole size be larger than the required finished size by 0.003 inch.
- It is recommended that all holes, conductive, non-conductive and tooling holes be drilled at the same time. This will reduce the direct labor cost while improving the registration tolerances for further processing.

The circuit pattern desired for the board may then be applied after this through hole metalization process. If desired, the circuit pattern may be applied before the through hole process and then the holes may be drilled after the pattern. The same process of through hole metallization is then used with an additional step of having to apply a clear protective layer of removable poly sheet to protect the already applied circuit before drilling.

EXAMPLE 7

To evaluate the planarization process versus the existing procedure, a test pattern was designed using 0.005 inch traces on 0.010 inch pitch and 0.008 inch traces on 0.016 inch pitch.

Using this test pattern and a typical multilayer pattern, samples were printed with and without the planarization process. These samples were then cut and measured with a DekTek profilometer.

The following table details the height differential measured from the last printed dielectric to the top of the metallization.

|  | Planarized Board Data | Non Planarized Board Data |
| --- | --- | --- |
| Test Board Results |  |  |
| 1$^{st}$ Metal Print Thickness on Substrate | 35 microns | 35 microns |
| Surface Irregularities after Planarization | 10 microns | N/A |
| Surface Irregularities after 1$^{st}$ Coat of Dielectric | 3 microns | 20 microns |
| Surface Irregularities after 2$^{nd}$ Coat of Dielectric | 2 microns | 5 microns |
| Test Circuit Results |  |  |
| 1$^{st}$ Metal Print Thickness of Substrate | 35 microns | N/A |
| Surface Irregularities after Planarization and 2 coats of Dielectric Prints | 2 microns | N/A |
| Surface Irregularities after 3 coats of Dielectric Prints and no planarization layer | N/A | 15 microns |
| 2$^{nd}$ Metal Print Thickness on Dielectric Coating | 37 microns | 40 microns |
| Surface Irregularities after Planarization and 2 coats of Dielectric Prints. (After 2$^{nd}$ Metal Print) | 2 microns | N/A |
| Surface Irregularities after 3 coats of Dielectric Prints and no planarization layer. (After 2$^{nd}$ Metal Print) | N/A | 17 microns |

The addition of a planarization layer nearly eliminates surface irregularities found in the existing process and reduces the dielectric layer thickness needed between metallization layers.

As the pitch of circuit traces becomes larger, using a planarization technique becomes more beneficial. Visual inspection of the sample boards verified better print quality for planarized, than that of non planarized boards. This is a key development, as it will enable additive material technology to produce several layers of interconnects without sacrificing print quality, while using this simplistic planarization technique.

Using this technique and a test pattern, four layer circuit boards were fabricated. Each board consisted of two metal layers on each side of the substrate with connecting vias utilizing the through hole method described in Example 1.

EXAMPLE 8

The approach of using photoimageable dielectrics was developed to achieve finer line widths. These photoimageable dielectrics can be imaged with the circuit design, creating open trenches. These open trenches are then back filled with TLPS conductive ink.

A two layer structure with trace widths of 1, 2, 3, 5, 6, 8 and 10 mils with via diameters as fine as 3 mils was designed for development and evaluation. An epoxy glass substrate material (FR4) 0.060 inch thick, was processed through each stage of lamination, imaging and development. Each substrate was coated and imaged using the chosen dielectrics. At this point, the substrates had traces imaged at a minimum thickness/depth of 2.0 mil. These substrates were then backfilled with TLPS ink and processed. Next, the boards were processed with the chosen dielectric a second time, to have the via holes imaged. The via holes were then filled with the TLPS conductive ink and the same steps were repeated for the third and final circuit layer.

Cross sections give a good indication of the capability of the process for a two layer structure. It indicates the ability to use solid blind vias for the fabrication of high density multilayer interconnects. Misalignment may be improved with the use of proper tooling and automated equipment. Furthermore, porosity in the metallization can be improved with properly designed fill equipment.

The test results reveal the ability to achieve 0.002 inch trace width on 0.004 inch circuit pitch.

What is claimed is:

1. A method of preparing a multilayer printed circuit board which comprises the steps of:
   (a) forming a first dielectric layer on a surface of a substrate wherein the first dielectric layer;
   (b) forming one or more first conductor grooves in said first dielectric layer and applying a first conductive ink composition into said first one or more conductor grooves;
   (c) heating the first conductive ink composition to a temperature and for a period of time sufficient to cure the first ink conductive composition whereby the cured first conductive ink composition forms first conductive traces;
   (d) forming an insulating layer on the surface of said first dielectric layer;
   (e) forming one or more vias in said insulating layer and applying a second conductive ink composition into said vias;
   (f) heating the second conductive ink composition to a temperature and for a period of time sufficient to cure the second ink conductive composition whereby the cured second conductive ink composition in said vias are in electrical contact with one or more of said first traces;
   (g) forming a second dielectric layer on the surface of said insulating layer wherein the second dielectric layer includes one or more second conductor grooves;
   (h) applying a third conductive ink composition into said second conductor grooves;
   (i) heating the third conductive ink composition to a temperature and for a period of time sufficient to cure the third ink conductive composition whereby the cured third conductive ink composition forms second conductive traces that are in electrical contact with the cured second conductive ink composition in said one or more of said vias.

2. The method of claim 1 further comprising the steps of: forming one or more additional layers of dielectric material having conductive traces, wherein each addition layer is fabricated by:
   (i) forming an insulating layer on the surface of the last dielectric layer wherein said insulating layer includes one or more vias;
   (ii) forming a dielectric layer on a surface of the insulating layer wherein the dielectric layer includes one or more conductor grooves;
   (iii) applying a conductive ink composition into said one or more conductor grooves;
   (iv) heating the conductive ink composition to a temperature and for a period of time sufficient to cure the conductive ink composition, whereby the cured ink conductive composition forms conductive traces.

3. The method of claim 1 wherein the first, second, and third conductive ink compositions each comprises:
   0–65% by volume of a high melting point metal,
   6–65% by volume of a low melting point metal or metal alloy,
   0–45% by volume of a resin,
   0.01–61% by volume of a chemically protected, cross-link agent,
   0–50% by volume of a reactive monomer or polymer, and
   0–10% by volume of a metal additive.

4. The method of claim 3 wherein the step of curing each conductive ink composition comprises:

heating at a temperature between about 100° to about 350° C. for a minimum of about 30 seconds.

5. The method of claim 1 further comprising the steps of:
   (i) forming one or more holes in the multilayer printed circuit board;
   (ii) applying a fourth conductive ink composition by vacuum to coat the surface of said one or more holes; and
   (iii) heating the fourth conductive ink composition to a temperature and for a period of time sufficient to cure the fourth conductive ink composition.

6. The method of claim 1 wherein the one or more conductor grooves in each dielectric layer are formed by photoimaging.

7. The method of claim 1 wherein the first and second conductive traces each has a minimum width of 0.001 inches and a minimum thickness of 0.0005 inches.

8. The method of claim 1 wherein the conductive ink composition comprises:
   13–65% by volume of a high melting point metal,
   6–29% by volume of a low melting point metal or metal alloy,
   0–15% by volume of a resin,
   7–60% by volume of a chemically protected, cross-link agent,
   0–32% by volume of a reactive monomer or polymer, and
   0–10% by volume of a metal additive.

9. The method of claim 1 wherein the substrate is formed from a material selected from the group consisting of first materials consisting of epoxy, polyimide, BT-expoxy, cyanate ester, phenolic, polyetherimide, polyethersulfone, polyetheretherketone, liquid crystal polymer, polyarylsufone, second materials consisting of any said first materials that is reinforced with, glass, paper or aramid fiber, metal, glass, quartz, graphite, and ceramic.

10. The method of claim 1 wherein the conductive ink composition comprises:
   25–60% by volume of a high melting point metal,
   8–29% by volume of a low melting point metal or metal alloy,
   0–12% by volume of a resin,
   7–45% by volume of a chemically protected, cross-link agent,
   0–28% by volume of a reactive monomer or polymer, and
   0–5% by volume of a metal additive.

11. A method of preparing a multilayer printed circuit board which comprises the steps of:
   (a) depositing a first conductive ink composition onto the surface of a substrate which defines a first circuit pattern;
   (b) curing said first conductive ink composition;
   (c) depositing a first dielectric material on the surface of said first circuit pattern so as to define one or more vias that are not coated with said first dielectric material;
   (d) depositing a second conductive ink composition onto the surface of said first dielectric material and into said one or more vias, wherein the second conductive ink composition defines a second circuit pattern that is in communication with said one or more first vias; and
   (e) curing said second conductive ink composition.

12. The method of claim 11 further comprising the steps of:
   forming one or more additional layers of circuit patterns, wherein each addition layer is fabricated by:
   (i) depositing a dielectric material on the surface of said previous circuit pattern so as to define one or more vias that are not coated with said dielectric material; and (ii) depositing a conductive ink composition onto the surface of said dielectric material and into said one ore more vias, wherein the conductive ink composition defines a circuit pattern that is in communication with said one or more vias in the dielectric material; and (iii) curing the conductive ink composition.

13. The method of claim 11 wherein the first and second conductive ink compositions each comprises:

0–65% by volume of a high melting point metal,

6–65% by volume of a low melting point metal or metal alloy,

0–45% by volume of a resin, 0.1–61% by volume of a chemically protected, cross-link agent, 0–50% by volume of a reactive monomer or polymer, and 0.5–10% by volume of a metal additive.

14. The method of claim 11 wherein the step of curing each conductive ink composition comprises:

heating at a temperature at between about 100° to about 350° C. for a minimum of about 5 seconds.

15. The method of claim 11 further comprising the steps of:

(i) forming one or more holes in the substrate;

(ii) applying conductive ink composition by vacuum to coat the surface of said one or more holes; and (iii) heating the conductive ink composition to a temperature and for a period of time sufficient to cure the conductive ink composition.

16. The method of claim 11 wherein the step of depositing each dielectric material comprises photoimaging.

17. The method of claim 11 wherein curing said first and second conductive ink compositions form conductive traces each with a minimum width of 0.001 inches.

18. The method of claim 11 wherein the conductive ink composition comprises

13–65% by volume of a high melting point metal,

6–29% by volume of a low melting point metal or metal alloy,

0–15% by volume of a resin,

7–60% by volume of a chemically protected, cross-link agent,

0–32% by volume of a reactive monomer or polymer, and 0.5–10% by volume of a metal additive.

19. The method of claim 11 wherein the substrate is formed from a material selected from the group consisting of first materials consisting of epoxy, polyimide, BT-epoxy, cyanate ester, phenolic, polyetherimide, polyethersulfone, polyetheretherketone, liquid crystal polymer, polyarylsufone, second materials consisting of any of said first materials that is reinforced with, glass, paper or aramid fiber metal, glass, quartz, graphite, and ceramic.

20. The method of claim 11 wherein the conductive ink composition comprises:

25–60% by volume of a high melting point metal,

8–29% by volume of a low melting point metal or metal alloy,

0–12% by volume of a resin,

7–45% by volume of a chemically protected, cross-link agent,

0–28% by volume of a reactive monomer or polymer, and

0–5% by volume of a metal additive.

21. A method of preparing a multilayer printed circuit board which comprises the steps of:

(a) providing a plurality of substrates wherein each substrate defines one or more openings;

(b) coating the surfaces of said openings with a first conductive ink composition wherein the one or more openings define one or more vias;

(c) forming a patterned layer of a second conductive ink composition on a surface of each substrate;

(d) aligning the plurality of substrates;

(e) laminating the substrates with sufficient pressure to cause the second conductive ink composition from the patterned layers to fill said one or more vias; and (f) curing the first and second conductive ink compositions.

22. The method of claim 21 wherein said first conductive ink composition is coated on the surface of said openings is cured prior to step d.

23. The method of claim 21 wherein the conductive ink composition comprises:

0–65% by volume of a high melting point metal,

6–65% by volume of a low melting point metal or metal alloy,

0–45% by volume of a resin, 0.01–61% by volume of a chemically protected, cross-link agent, 0–50% by volume of a reactive monomer or polymer, and 0–10% by volume of a metal additive.

24. The method of claim 21 wherein each patterned layer is formed by photoimaging.

25. The method of claim 21 wherein each patterned layer is formed by screen or stencil printing.

26. The method of claim 21 wherein the step of curing the first and second conductive ink compositions comprises:

heating at a temperature at between about 100° to about 350° C. for a minimum of about 5 seconds.

27. The method of claim 21 wherein the second conductive ink composition on said patterned layer when cured forms traces each with minimum width of 0.001 inches.

28. The method of claim 21 wherein each conductive ink composition comprises:

13–65% by volume of a high melting point metal,

6–29% by volume of a low melting point metal or metal alloy,

0–15% by volume of a resin.

7–60% by volume of a chemically protected, cross-link agent,

0–32% by volume of a reactive monomer or polymer, and 0.5–10% by volume of a metal additive.

29. The method of claim 21 wherein step (b) of coating said one or more holes is achieved by a vacuum process.

30. The method of claim 21 wherein the thickness of each substrate is between about 0.002 to about 2 inches.

31. The method of claim 21 wherein the patterned layer of the second conductive ink composition is formed by screen or stencil printing.

32. The method of claim 21 wherein step (b) of coating said one or more holes comprises using screen or stencil printing to deposit said first conductive composition into said one or more holes and then applying vacuum to uniformly distribute said first conductive ink composition over the entire surface of said holes.

* * * * *